(12) United States Patent
Kim

(10) Patent No.: US 11,097,950 B2
(45) Date of Patent: Aug. 24, 2021

(54) GRAPHENE FABRICATION METHOD

(71) Applicant: Korea Electronics Technology Institute, Seongnam-si (KR)

(72) Inventor: Hyeong Keun Kim, Yongin-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 87 days.

(21) Appl. No.: 16/310,636

(22) PCT Filed: May 15, 2017

(86) PCT No.: PCT/KR2017/005005
§ 371 (c)(1),
(2) Date: Dec. 17, 2018

(87) PCT Pub. No.: WO2018/212365
PCT Pub. Date: Nov. 22, 2018

(65) Prior Publication Data
US 2019/0322532 A1 Oct. 24, 2019

(51) Int. Cl.
*C01B 32/188* (2017.01)
*C23C 16/01* (2006.01)
(Continued)

(52) U.S. Cl.
CPC .......... *C01B 32/188* (2017.08); *C01B 32/186* (2017.08); *C23C 16/01* (2013.01);
(Continued)

(58) Field of Classification Search
CPC ..... C01P 2004/03; C23C 16/01; C23C 16/02; C23C 16/26; C23C 16/042; C23C 16/047;
(Continued)

(56) References Cited

U.S. PATENT DOCUMENTS

2012/0241069 A1* 9/2012 Hofmann ............... C01B 32/184
156/60
2013/0341792 A1* 12/2013 Noda ................. H01L 29/78603
257/741
2014/0065359 A1* 3/2014 Udapi Roa Kulkarni ..................
B23K 26/0661
428/141

FOREIGN PATENT DOCUMENTS

CN 103311386 A * 9/2013
CN 106315570 A * 1/2017
(Continued)

OTHER PUBLICATIONS

Köhne, David, et al. "Large Area Silica Nano Grids by Homogeneous High Resolution Laser Patterning of SiO sub x-Films." Journal of Laser Micro Nanoengineering 10.2 (2015): 158.*
(Continued)

*Primary Examiner* — Richard M Rump
(74) *Attorney, Agent, or Firm* — NSIP Law

(57) ABSTRACT

A graphene fabrication method which can obtain graphene of high quality and good characteristics by adjusting a size and a shape of a domain of graphene is provided. The method for fabricating graphene according to the present disclosure includes: a graphene pattern forming step of forming a graphene forming pattern on a graphene growth substrate; and a graphene forming step of forming a graphene layer on the graphene growth substrate having the graphene forming pattern formed thereon.

12 Claims, 12 Drawing Sheets

(51) Int. Cl.
*C23C 16/04* (2006.01)
*C01B 32/186* (2017.01)
*C23C 16/26* (2006.01)

(52) U.S. Cl.
CPC .......... *C23C 16/042* (2013.01); *C23C 16/047* (2013.01); *C23C 16/26* (2013.01); *C01P 2004/03* (2013.01)

(58) Field of Classification Search
CPC ... C01B 32/184; C01B 32/186; C01B 32/188; C01B 32/1888
See application file for complete search history.

(56) References Cited

FOREIGN PATENT DOCUMENTS

| KR | 10-2012-0111400 A | | 10/2012 |
|---|---|---|---|
| KR | 20150004965 A | * | 1/2015 |
| KR | 20150012454 A | * | 2/2015 |

OTHER PUBLICATIONS

International Search Report dated Oct. 4, 2018 in International Patent Application No. PCT/KR2017/005005 (34 pages in Korean, with English translation).

\* cited by examiner

GRAPHENE FABRICATION METHOD

CROSS REFERENCE TO RELATED APPLICATIONS

This application is a U.S. National Stage Application of International Application No. PCT/KR/2017/005005, filed on May 15, 2017.

TECHNICAL FIELD

The present disclosure relates to a graphene fabrication method, and more particularly, to a graphene fabrication method which can obtain graphene of high quality and good characteristics by adjusting a size and a shape of a domain of graphene.

BACKGROUND ART

Graphene, which is being in the spotlight in recent years, is flexible, has high electrical conductivity, and is transparent. Therefore, researches for using graphene for a transparent and bendable electrode or utilizing as an electronic transmission material such as an electron transport layer in an electronic device are ongoing.

To mass-produce graphene-based films, criteria such as temperature, synthesizing velocity, and whether large area synthesis is possible should be considered in synthesizing graphene. In this regard, there are various related-art methods for synthesizing graphene, and in particular, exfoliation (so-called Scotch tape method) or a direct growth method for directly growing graphene on a metal catalyst is being used.

However, in the case of exfoliation, graphene and many graphite layers may be easily broken in the process of depositing a scotch tape on a substrate, which is a process basically depending on a coincidence, and graphene and graphite pieces may be disorderly mixed on the substrate.

The direct growth method, which directly grows graphene on a metal catalyst, grows graphene by supplying a reaction source including a carbon source to the metal catalyst, and heating the metal catalyst under atmospheric pressure. According to the direct growth method, large area graphene of relatively high quality may be produced.

The large area graphene refers to a single graphene layer which is formed by combining graphene pieces grown at various points on a growth substrate. To form the large area graphene, graphene growth points are arbitrarily selected, and thus respective grown graphene areas, that is, domains of graphene, do not have regular sizes, and defects may occur in portions where graphene domains overlap one another.

FIG. 1 illustrates an SEM image of graphene which is synthesized by the direct growth method. Referring to FIG. 1, it can be seen that there are boundaries and wrinkles on graphene domains, and there are many line defects and point defects. The boundaries, wrinkles, and point defects caused by collision between graphene domains may harmfully influence electric characteristics of graphene.

Therefore, there is a demand for development of technology for fabricating large area graphene of good characteristics by minimizing defects in synthesizing graphene.

DISCLOSURE

Technical Problem

The present disclosure has been developed in order to address the above-discussed deficiencies of the prior art, and an object of the present disclosure is to provide a graphene fabrication method which can obtain graphene of high quality and good characteristics by adjusting a size and a shape of a domain of graphene.

Technical Solution

According to an embodiment of the present disclosure to achieve the above-described objects, a method for fabricating graphene includes: a graphene pattern forming step of forming a graphene forming pattern on a graphene growth substrate; and a graphene forming step of forming a graphene layer on the graphene growth substrate having the graphene forming pattern formed thereon.

The graphene growth substrate may include one or more metals selected from the group consisting of Ni, Co, Fe, Pt, Au, Al, Cr, Cu, Mg, Mn, Mo, Rh, Si, Ge, Ta, Ti, W, U, V, Zr, brass, bronze, cupro-nickel and stainless steel or an alloy thereof.

The graphene forming pattern may be a pattern for suppressing growth of the graphene layer.

The graphene pattern forming step may include radiating light to the graphene growth substrate. Radiating the light may include radiating at least one of intense pulsed light (IPL) and laser light.

The graphene forming pattern may be a honeycombed pattern in which a hexagonal pattern is repeated.

The graphene layer may have a domain of a shape which is the same as the graphene forming pattern.

According to another aspect of the present disclosure, there is provided graphene which is fabricated according to a graphene fabrication method, including: a graphene pattern forming step of forming a graphene forming pattern on a graphene growth substrate; and a graphene forming step of forming a graphene layer on the graphene growth substrate having the graphene forming pattern formed thereon, and which has a honeycombed pattern in which a hexagonal pattern is repeated.

According to still another aspect of the present disclosure, there is provided a graphene forming substrate which has a graphene domain control pattern formed on at least one surface thereof to control a graphene domain, the graphene domain control pattern having a honeycombed shape in which a hexagonal pattern is repeated.

According to yet another aspect of the present disclosure, there is provided a method for fabricating a graphene forming substrate, including: placing a mask corresponding to a graphene forming pattern on an upper portion of a graphene growth substrate; and radiating light to an upper portion of the mask.

Radiating the light may include radiating at least one of IPL and laser light. Radiating the IPL may include radiating by using a flash lamp or a xenon lamp, and radiating the laser light may include radiating by using any one laser selected from a Nd:YAG laser, a $CO_2$ laser, an argon laser, an excimer laser, and a diode laser.

Advantageous Effects

According to the graphene fabrication method according to embodiments of the present disclosure as described above, the size and the shape of the domain of graphene can be effectively adjusted and thus defects of graphene can be minimized, and graphene of good characteristics can be fabricated.

BEST MODE

Hereinafter, embodiments of the present disclosure will be described in detail with reference to the accompanying drawings. Various changes can be made to embodiments of the present disclosure, and the scope of the present disclosure is not limited to the embodiments described below. Embodiments introduced hereinafter are provided by way of an example such that the idea of the present disclosure is fully conveyed to a person skilled in the art. There may be an element illustrated as having a specific pattern or having a predetermined thickness, but this is just for explaining or easily distinguishing, and thus the present disclosure is not limited to the feature of the element having the specific pattern or predetermined thickness.

Graphene to be fabricated by the present disclosure refers to graphene in the form of a layer or sheet of a polycyclic aromatic molecule by connecting a plurality of carbon atoms with one another by covalent bond. The carbon atoms connected with one another by covalent bond in a graphene layer forms a six-membered ring as a basic repeating unit, but the graphene layer may further include a five-membered ring or a seven-membered ring. In particular, when growth directions of graphene on domain boundaries are different, the respective domains may collide with one another, causing the five-membered ring or the seven-membered ring to be formed, and such an irregular crystal arrangement may degrade the quality of graphene. When graphene grows and crystals increase, horizontal expansion occurs. In this case, when graphene formed at a certain point and graphene formed at another point meet each other, a boundary is formed at the point where the graphene meet, and a graphene area in the boundary is referred to as a domain.

The graphene is shown as a single layer of carbon atoms (typically, sp2 bond) connected with one another by covalent bond. The graphene may have various structures, and the structure of graphene may vary according to a content of a five-membered ring and/or a seven-membered ring which may be included in the graphene. Although the graphene is formed in the form of a single layer as described above, a plurality of layers of graphene may be formed by stacking single layers of graphene one on another, and typically, a distal end of a side surface of the graphene may be saturated.

FIGS. 2 to 9 are views provided to explain a graphene fabrication method according to an embodiment of the present disclosure. The graphene fabrication method according to the present embodiment may include: a graphene pattern forming step of forming a pattern 111 for forming graphene on a graphene growth substrate 110; and a graphene forming step of forming a graphene layer 120 on the graphene growth substrate 110 having the graphene forming pattern 111 formed thereon.

Figure 1:
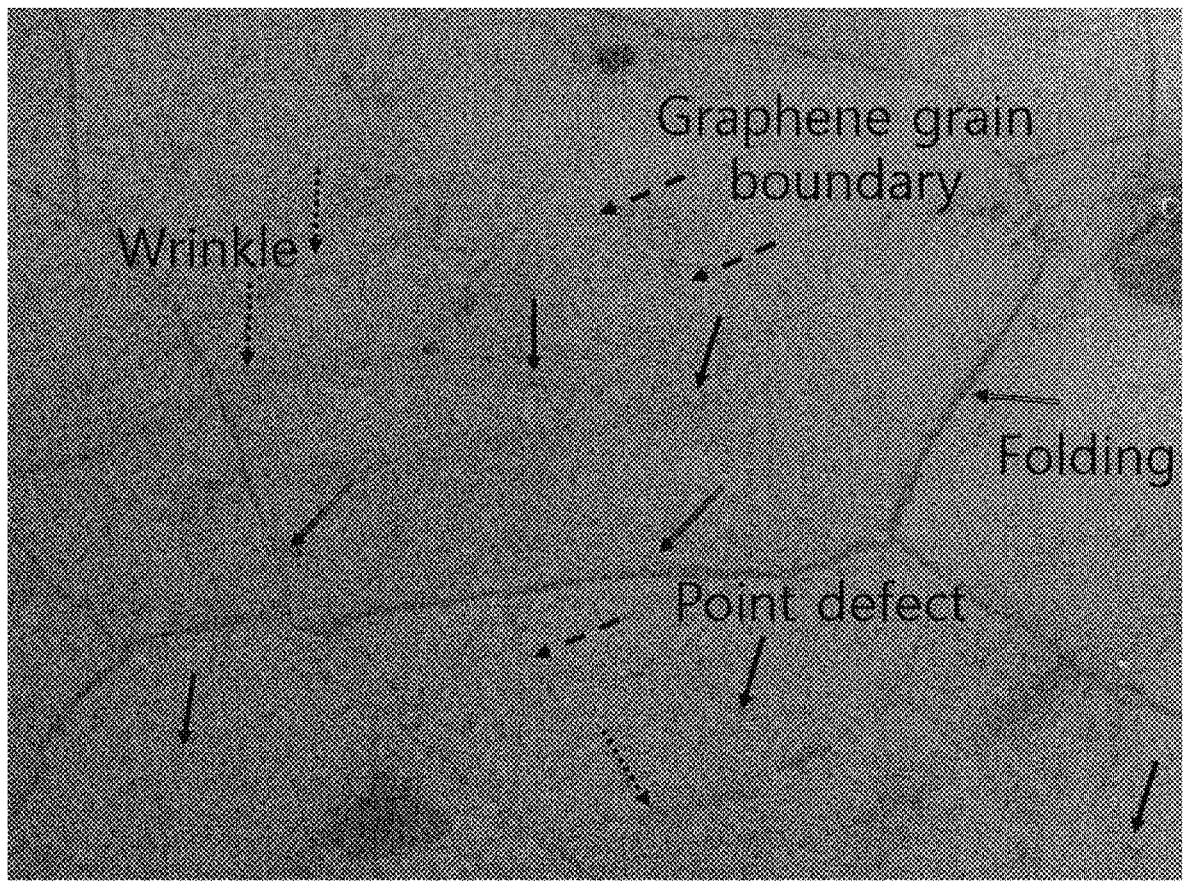
FIG. 1 is a view illustrating an SEM image of graphene which is synthesized by a direct growth method.
Figure 2:
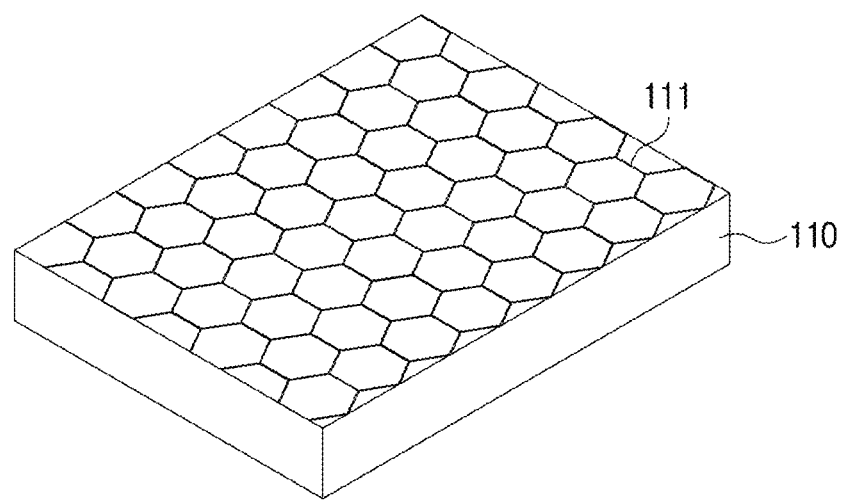
FIGS. 2 to 9 are views provided to explain a graphene fabrication method according to an embodiment of the present disclosure.

Referring to FIG. 2, the graphene pattern forming step of forming the graphene forming pattern 111 on the graphene growth substrate 110 is performed first.

The graphene growth substrate 110 functions as a base (seed layer) for growing graphene, and is not limited to a specific material. For example, the graphene growth substrate 110 may include one or more metals selected from the group consisting of Ni, Co, Fe, Pt, Au, Al, Cr, Cu, Mg, Mn, Mo, Rh, Si, Ge, Ta, Ti, W, U, V, Zr, brass, bronze, cupronickel and stainless steel or an alloy thereof.

The graphene growth substrate 110 may further include a catalyst layer (not shown) for promoting adsorption of carbon to easily grow the graphene. The catalyst layer is not limited to a specific material, and may be formed of the same or different material as or from that of the graphene growth substrate 110. Thickness of the catalyst layer is not also limited, and the shape of the catalyst layer may be a thin film or a thick film.

Figure 3:
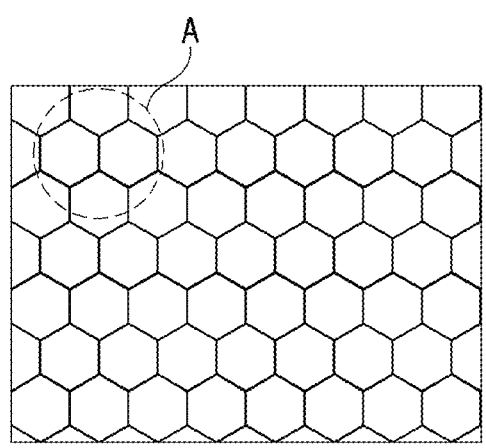
Figure 4:
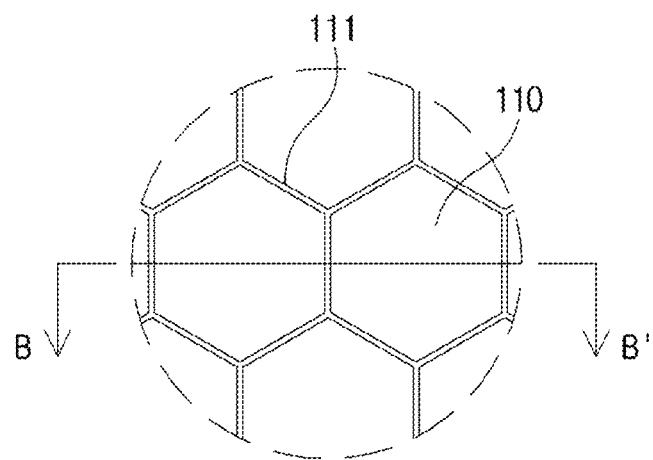

The graphene forming pattern 111 is a pattern for forming graphene, and may be directly formed on a surface of the graphene growth substrate 110. When graphene is formed on the graphene growth substrate 110, the graphene is formed according to the graphene forming pattern 111. Therefore, the graphene forming pattern 111 may be formed according to a size or shape of graphene to be synthesized as desired. It is most preferable that the graphene has a crystal structure of a six-membered ring as described above, and it is preferable that a graphene domain collides with another graphene domain as linearly as possible when growing, in order to have the crystal structure of the six-membered ring. Accordingly, the graphene forming pattern 111 may be a honeycombed pattern in which a hexagonal pattern is repeated as shown in FIG. 3. FIG. 4 is an enlarged view of the area A of FIG. 3.

The graphene forming pattern 111 may be formed by radiating light to the graphene growth substrate. When a pattern layer is further formed by coating the graphene growth substrate 110 with another material to form the graphene forming pattern 111, the pattern layer may influence a thin graphene layer. Therefore, the graphene forming pattern 111 according to the present disclosure may be formed by radiating light to the graphene growth substrate 110, and by oxidizing an area of the graphene growth substrate 110 to which light is radiated to suppress growth of graphene.

Radiating the light may be performed by radiating at least one of intense pulsed light (IPL) and laser light. A desired pattern may be formed on the graphene growth substrate 110 by radiating IPL. The IPL refers to light having a wide spectrum ranging from 350 nm to 1200 nm, and may be radiated by using a flash lamp or a xenon lamp. The IPL radiation radiates light in the form of a pulse at high speed, and thus has the advantage of heating only a portion instantaneously without damaging the substrate. In addition, the IPL radiation may be performed in a short time by focusing heat onto a domain boundary of graphene or a defect portion.

The laser light radiation may be performed by using a laser selected from a Nd: YAG laser, a $CO_2$ laser, an argon laser, an excimer laser, and a diode laser.

Figure 5:
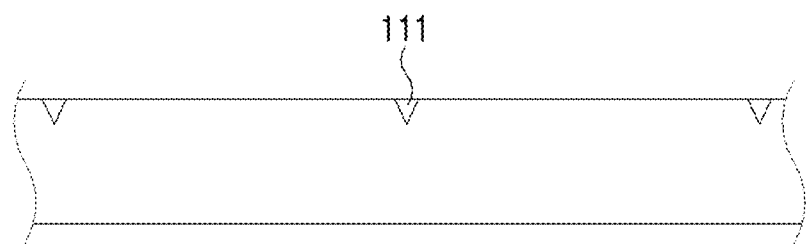

FIG. 5 is a cross-sectional view taken on line B-B' of FIG. 4. Referring to FIG. 5, it can be seen that light radiation is performed on the graphene growth substrate 110 and a light radiation portion is formed in a V shape. The light radiation portion forms the graphene forming pattern 111 of the hexagonal shape as shown in FIG. 4.

The graphene layer is formed on the graphene growth substrate 110 having the graphene forming pattern 111 of the hexagonal shape formed thereon. As a method for forming the graphene layer 120 on the graphene growth substrate 110, chemical vapor deposition (CVD) may be used. Herein, the CVD may include rapid thermal CVD (RTCVD), inductively coupled plasma CVD (ICP-CVD), low pressure CVD (LPCVD), atmospheric pressure CVD (APCVD), metal organic CVD (MOCVD), or plasma-enhanced CVD (PECVD).

Specifically, the graphene layer 120 may be formed by putting the graphene growth substrate 110 having the graphene forming pattern 111 formed thereon into a reactor, supplying a reaction gas including a carbon source to the graphene growth substrate 110, heating under atmospheric pressure, and growing graphene.

Herein, the heat treatment temperature may range from 300° C. to 2,000° C. An appropriate amount of carbon may melt or may be adsorbed onto the graphene growth substrate 110 by reacting the graphene growth substrate 110 with the carbon source at high temperature and under atmospheric pressure, and then carbon atoms included in the graphene growth substrate 110 crystallize on the surface, thereby forming a graphene crystal structure.

In the above-described process, the number of graphene layers 120 may be adjusted by adjusting a type and thickness (including a catalyst layer) of the graphene growth substrate 110, a reaction time, a cooling speed, a concentration of the reaction gas, or etc.

The carbon source may include, for example, carbon monoxide, carbon dioxide, methane, ethane, ethylene, ethanol, acetylene, propane, butane, butadiene, pentane, pentene, cyclopentadiene, hexane, cyclohexane, benzene, toluene, or etc.

When the reaction gas including the carbon source is supplied under atmospheric pressure, and heat treatment is performed by using a heat source which can control temperature, carbon components existing in the carbon source are combined with one another, thereby forming a hexagonal plate structure on the surface of the graphene growth substrate 110 and synthesizing graphene.

Figure 6A:
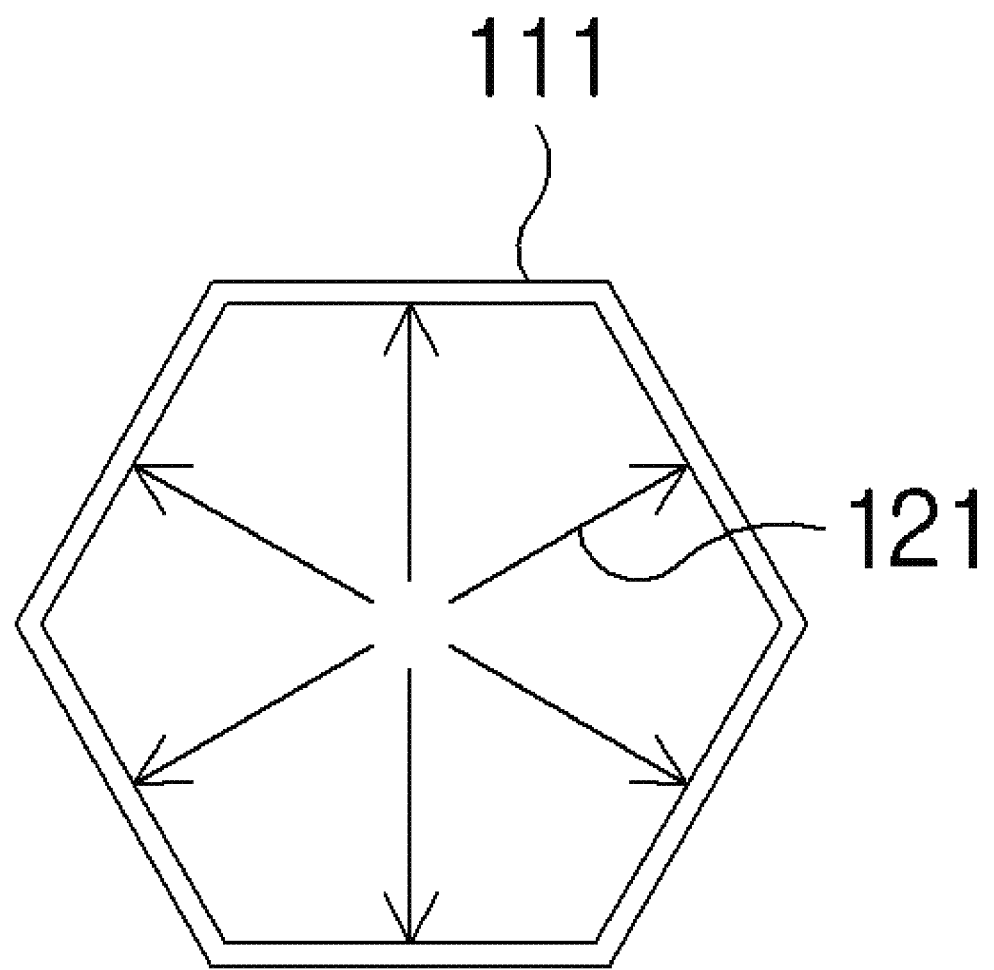

Referring to FIG. 6A, it can be seen that the graphene grows from the center of the graphene forming pattern 111 to the graphene forming pattern 111 along graphene growth directions 121 in the graphene growing pattern 111.

Figure 6B:
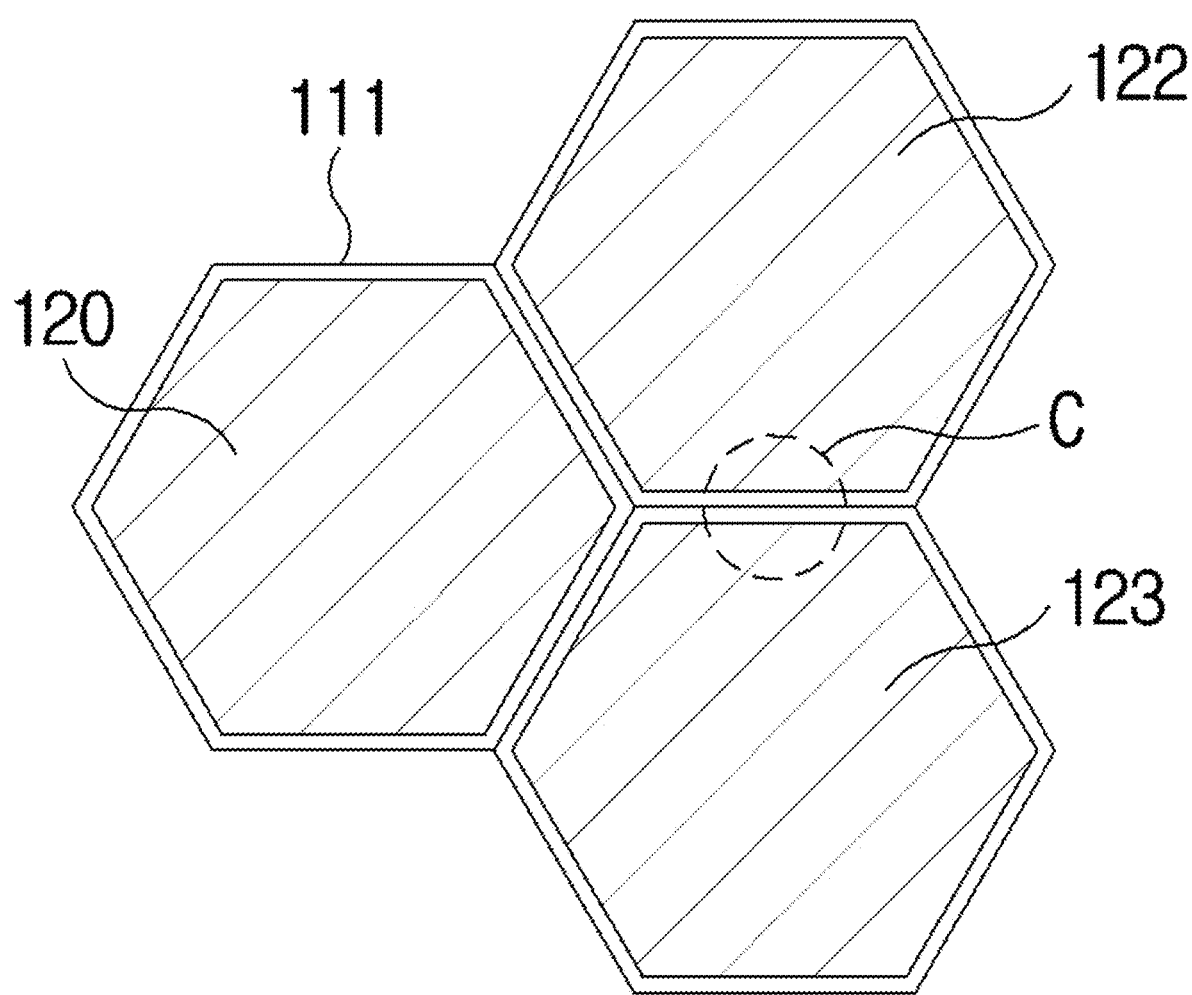
Figure 7:
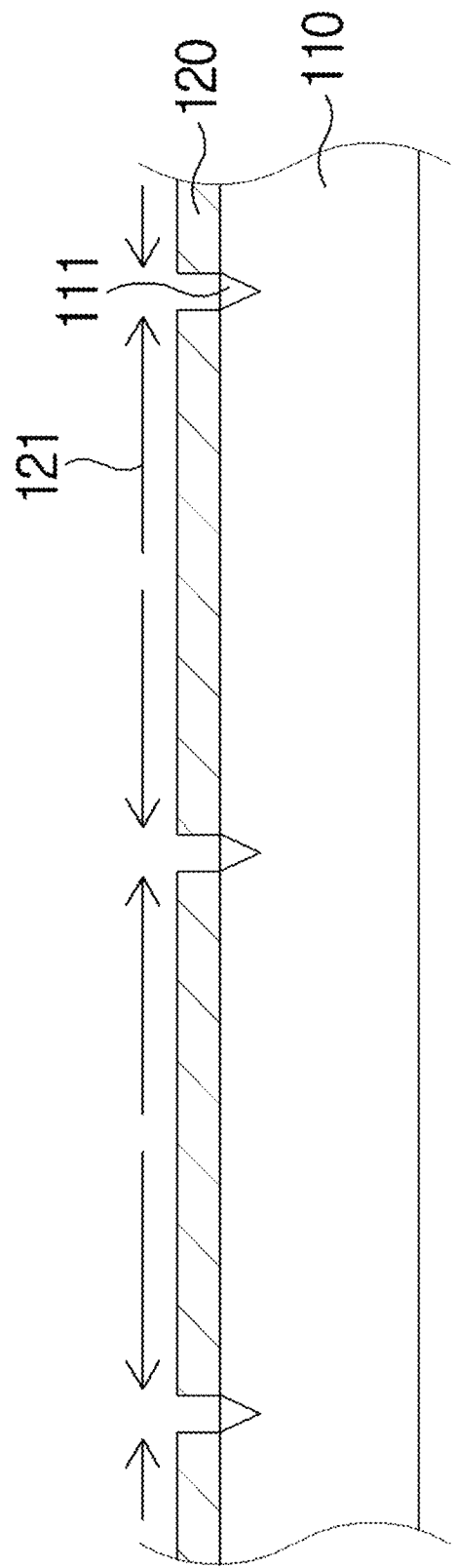

When the graphene is formed in the graphene forming pattern 111 as described above, a shape or a size of a domain of the graphene is controlled by the graphene forming pattern 111 as shown in FIG. 6B. Referring to FIG. 7, the graphene layer 120 is formed with reference to the center of the graphene forming pattern 111 in the graphene growth directions 121, and growth of graphene is suppressed in the area of the graphene forming pattern 111.

Figure 8:
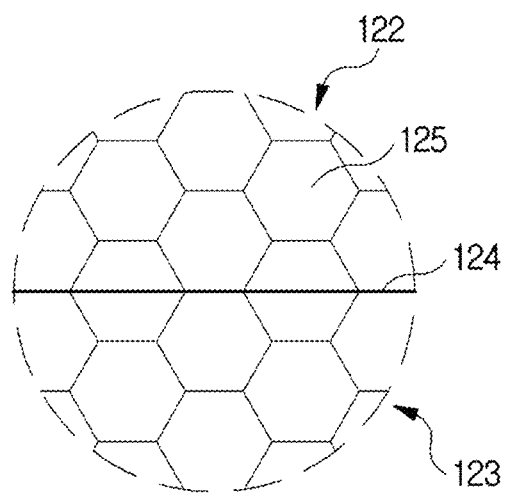
Figure 9:
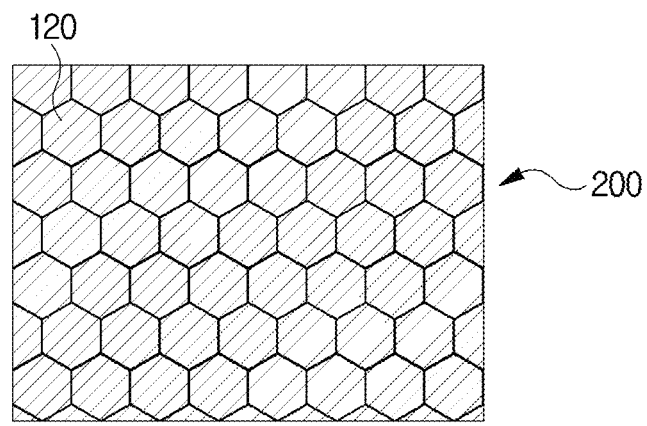

FIG. 8 is an enlarged view of the C area of FIG. 6B where two adjacent graphene domains meet each other. The upper graphene domain may be referred to as a first graphene domain 122, and the lower graphene domain may be referred to as a second graphene domain 123. In this case, a graphene domain boundary 124 where the first graphene domain 122 and the second graphene domain 123 grow and meet each other is formed. Although FIG. 7 depicts that the graphene layer 120 is not formed in the area of the graphene forming pattern 111, it does not mean that the graphene 120 is not formed, and means that nucleation does not occur in the area of the graphene forming pattern 111 due to light radiation to metal. Therefore, when the graphene layer is implemented in multi-layer, the grown graphene may cover the area of the graphene forming pattern 111.

A graphene crystal 125 is formed inside the first graphene domain 122 in the form of a six-membered ring. According to the graphene fabrication method according to the present disclosure, the graphene forming pattern 111 is formed and growth of graphene is promoted inside the graphene forming pattern 111, and growth of graphene is suppressed in the area of the graphene forming pattern 111. As a result, the boundary where the first graphene domain 122 and the second graphene domain 123 meet each other is formed in a straight line. Accordingly, it is highly likely that the graphene crystal on the graphene domain boundary 124 has a six-membered ring, and generation of a five-membered ring or a seven-membered ring is minimized and thus a graphene layer of high quality can be formed.

The graphene 200 having the graphene layer 120 formed therein as described above is illustrated in FIG. 9. Each graphene domain is implemented in a hexagonal shape, and is shown as the shape of the graphene forming pattern 111 is transferred. According to another aspect of the present disclosure, there is provided graphene which is fabricated by the graphene fabrication method including: the graphene pattern forming step of forming the graphene forming pattern on the graphene growth substrate; and the graphene forming step of forming the graphene layer on the graphene growth substrate having the graphene forming pattern formed thereon, and which has a honeycombed domain having a hexagonal pattern repeated.

After the graphene layer 120 is formed, the graphene growth substrate 110 may be removed. The graphene growth substrate 110 may be removed by using a roll to roll device including a chamber containing an etching solution for selectively removing the graphene growth substrate 110. The etching solution may be selected according to a type of the graphene growth substrate 110, and may be, for example, hydrogen fluoride (HF), buffered oxide etch (BOE), a ferric chloride ($FeCl_3$) solution, or a ferric nitrate ($Fe(NO_3)_3$) solution.

Figure 10:
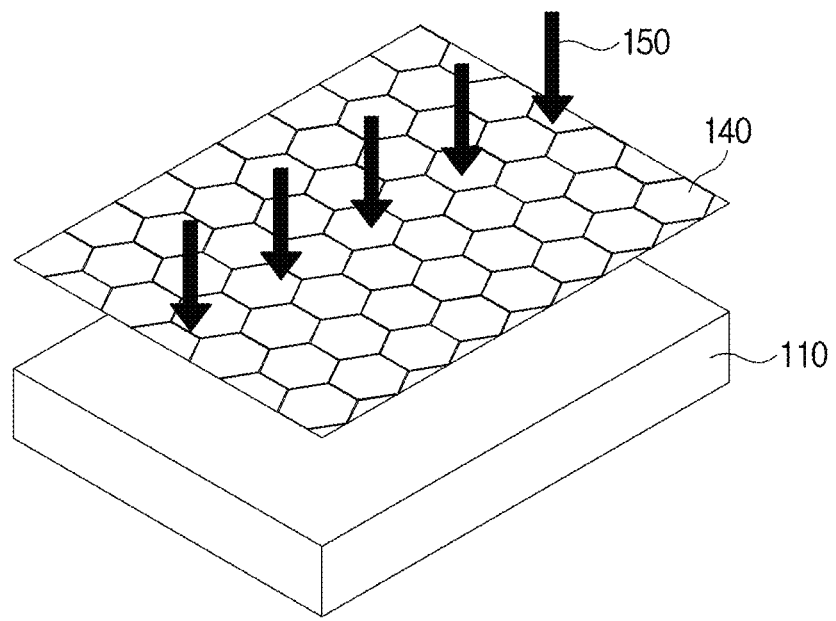
FIG. 10 is a view provided to explain a method for fabricating a substrate for forming graphene according to another embodiment of the present disclosure.

FIG. 10 is a view provided to explain a method for fabricating a graphene forming substrate according to another embodiment of the present disclosure. According to the present embodiment, the method for fabricating the graphene forming substrate includes the steps of: placing a mask corresponding to a graphene forming pattern on an upper portion of a graphene growth substrate; and radiating light to an upper portion of the mask.

To fabricate the graphene forming substrate, a mask 140 having a honeycombed shape having a hexagonal pattern repeated, which is the same as that of the graphene forming pattern 111, is placed on the graphene growth substrate 110, and, when light radiation 150 is performed on the upper portion of the mask 140, the graphene forming pattern 111 is formed on the graphene growth substrate 110 due to the light radiation in the form of the mask 140.

According to still another aspect of the present disclosure, there is provided a graphene forming substrate having a graphene domain control pattern formed thereon to control a graphene domain and having a honeycombed shape having a hexagonal pattern repeated.

Figure 11:
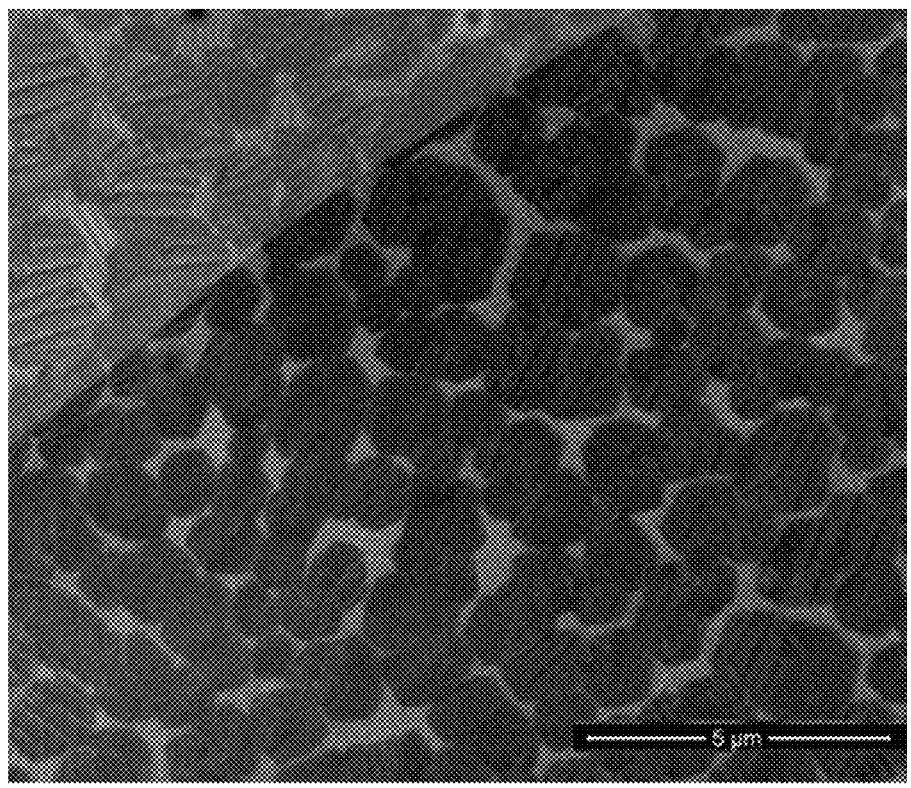
FIG. 11 is a view illustrating an SEM image of graphene which is formed on an N.M. rolled copper foil according to a graphene fabrication method according to an embodiment of the present disclosure.
Figure 12:
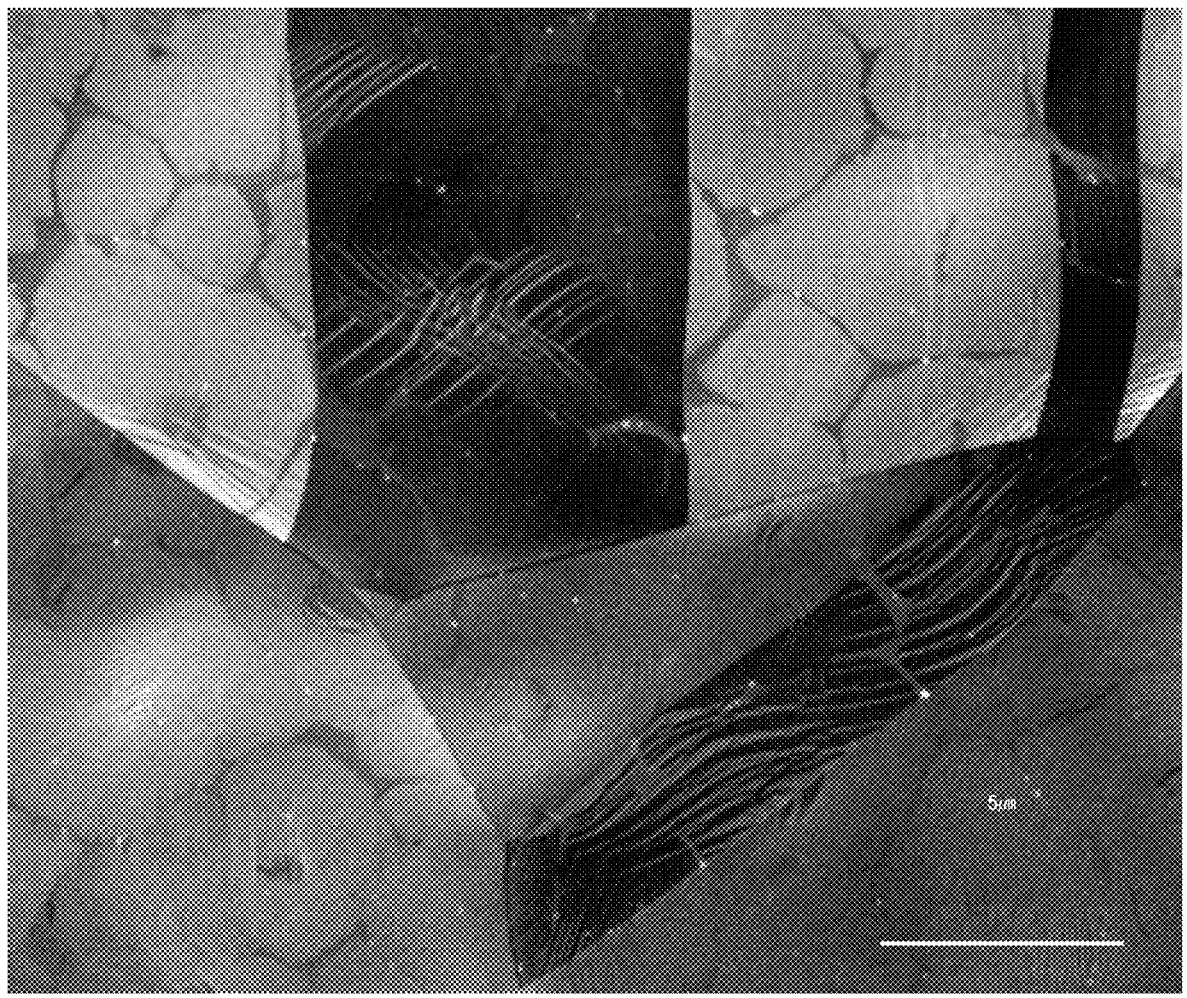
FIG. 12 is a view illustrating an SEM image of graphene which is formed on an N.M. rolled copper foil without forming a graphene pattern.
Figure 13:
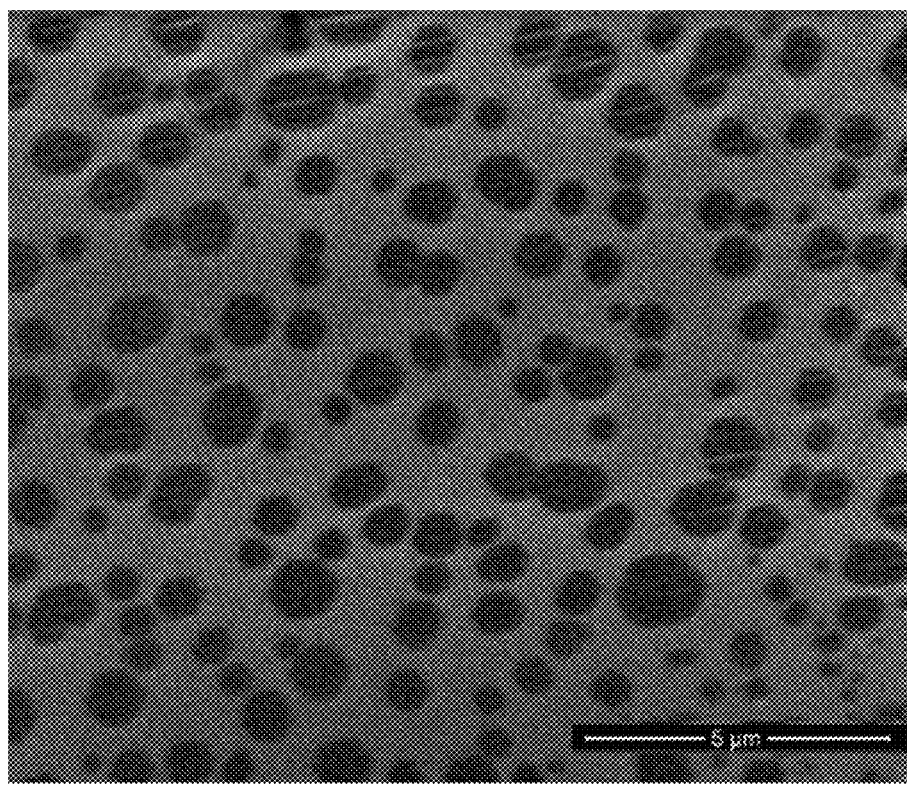
FIG. 13 is a view illustrating an SEM image of graphene which is formed on an SRC rolled copper foil according to a graphene fabrication method according to an embodiment of the present disclosure.
Figure 14:
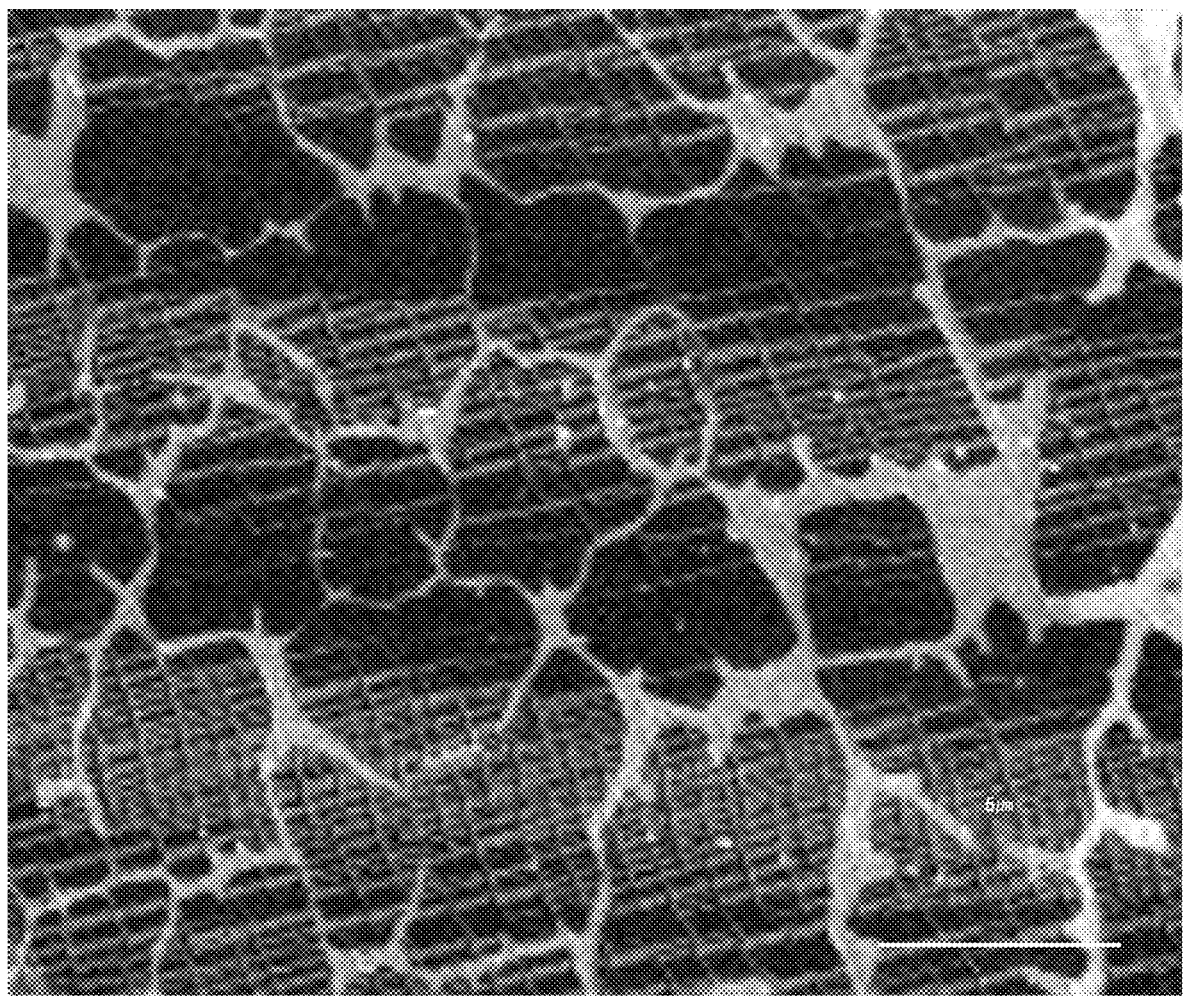
FIG. 14 is a view illustrating an SEM image of graphene which is formed on an SRC rolled copper foil without forming a graphene pattern.

FIG. 11 illustrates an SEM image of graphene which is formed on an N.M. rolled copper foil according to the graphene fabrication method according to an embodiment of the present disclosure, FIG. 12 illustrates an SEM image of graphene which is formed on an N.M. rolled copper foil without forming a graphene pattern, FIG. 13 illustrates an SEM image of graphene which is formed on an SRC rolled copper foil according to the graphene fabrication method according to an embodiment of the present disclosure, and FIG. 14 illustrates an SEM image of graphene which is formed on an SRC rolled copper foil without forming a graphene pattern. In FIGS. 11 and 13, a graphene pattern is formed on the N.M. rolled copper foil and the SRC rolled copper foil by using a Nd: YAG laser of 532 nm.

Referring to FIG. 11, dark portions on the surface of graphene are portions where graphene is grown, and defects such as boundaries or wrinkles do not appear between graphene domains. On the other hand, boundaries clearly appear between graphene domains on the surface of graphene of FIG. 12, which is grown on the same copper foil. That is, it can be seen that, when the pattern of the present disclosure is not formed on the surface of the copper foil, defects occur in the grown graphene.

In the case of the graphene shown in FIG. 13, graphene is uniformly grown without defects such as boundaries or wrinkles between graphene domains, similarly to the graphene of FIG. 11. However, in the case of the surface of graphene of FIG. 14 which is formed on the same copper foil, it can be seen that the sizes of domains of graphene are not regular and wrinkles clearly appear with domain boundaries, and thus graphene of low quality is obtained.

According to the embodiments of the present disclosure as described above, graphene is grown by using the graphene forming pattern, and the graphene domains having the same shape as that of the graphene forming pattern are formed. That is, defects or damage can be minimized by adjusting the shape and the size of the graphene domain, and graphene of high quality can be obtained.

While preferred embodiments of the present disclosure have been shown and described, it will be understood by those skilled in the art that the present disclosure can be variously modified and changed by adding, changing, or deleting elements without departing from the scope of the present disclosure described in the claims, and such changes and modification are included in the scope of the present disclosure.

The invention claimed is:

1. A method for fabricating graphene, the method comprising:
   a graphene growth substrate step of fabricating a graphene growth substrate, comprising:
      placing a mask corresponding to a graphene forming pattern on an upper portion of the graphene growth substrate;
      radiating light to an upper portion of the mask to form the graphene forming pattern thereon; and
      oxidizing an area of the graphene forming substrate to which the light is radiated to suppress growth of graphene;
   a graphene pattern forming step of forming a graphene forming pattern on the graphene growth substrate; and
   a graphene forming step of forming a graphene layer on the graphene growth substrate by suppressing growth of the graphene layer in an area of the graphene forming pattern, the graphene growth substrate having the graphene forming pattern formed thereon,
   wherein growth of the graphene layer starts in a direction from a center of the graphene forming pattern toward a boundary thereof.

2. The method of claim 1, wherein the graphene growth substrate comprises one or more metals selected from the group consisting of Ni, Co, Fe, Pt, Au, Al, Cr, Cu, Mg, Mn, Mo, Rh, Si, Ge, Ta, Ti, W, U, V, Zr, brass, bronze, cupronickel and stainless steel or an alloy thereof.

3. The method of claim 1, wherein the graphene forming pattern is a pattern for suppressing the growth of the graphene layer.

4. The method of claim 1, wherein the graphene pattern forming step comprises radiating light to the graphene growth substrate.

5. The method of claim 4, wherein radiating the light comprises radiating at least one of intense pulsed light (IPL) and laser light.

6. The method of claim 1, wherein the graphene forming pattern is a honeycombed pattern in which a hexagonal pattern is repeated.

7. The method of claim 1, wherein the graphene layer has a domain of a shape which is the same as the graphene forming pattern.

8. The method of claim 5, wherein radiating the IPL comprises radiating by using a flash lamp or a xenon lamp,
   wherein radiating the laser light comprises radiating by using any one laser selected from a Nd: YAG laser, a $CO_2$ laser, an argon laser, an excimer laser, and a diode laser.

9. The method of claim 1, further including a catalyst layer configured to promote adsorption of carbon to grow the graphene layer.

10. The method of claim 1, further comprising:
    performing a heat treatment process onto the graphene growth substrate, wherein a heat treatment temperature ranges from 300° C. to 2000° C.

11. The method of claim 1, further comprising:
    performing a heating process onto the graphene growth substrate;
    reacting the graphene growth substrate with a carbon source; and
    forming a crystal structure in the graphene layer based on the reacting.

12. The method of claim 1, wherein the graphene forming pattern includes a plurality of hexagonal patterns, and
    wherein the graphene layer, being formed, has plural domains in a respective shape which is the same as the graphene forming pattern.

* * * * *